United States Patent
Iyengar et al.

(10) Patent No.: US 8,181,135 B2
(45) Date of Patent: May 15, 2012

(54) HOLD TRANSITION FAULT MODEL AND TEST GENERATION METHOD

(75) Inventors: Vikram Iyengar, Pittsburgh, PA (US); Pamela S. Gillis, Essex Junction, VT (US); David E. Lackey, Essex Junction, VT (US); Steven F. Oakland, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 12/548,977

(22) Filed: Aug. 27, 2009

(65) Prior Publication Data

US 2011/0055650 A1    Mar. 3, 2011

(51) Int. Cl.
  *G06F 17/50*    (2006.01)
(52) U.S. Cl. .......................... 716/108; 716/107
(58) Field of Classification Search .......... 716/106–108
  See application file for complete search history.

(56) References Cited

U.S. PATENT DOCUMENTS

| | | | |
|---|---|---|---|
| 5,583,787 A | 12/1996 | Underwood et al. | |
| 6,353,906 B1 | 3/2002 | Smith et al. | |
| 6,453,436 B1 * | 9/2002 | Rizzolo et al. | 714/726 |
| 6,490,702 B1 * | 12/2002 | Song et al. | 714/726 |
| 6,651,227 B2 | 11/2003 | Abadir et al. | |
| 6,694,454 B1 | 2/2004 | Stanley | |
| 7,216,271 B2 | 5/2007 | Tanaka et al. | |
| 7,962,869 B2 * | 6/2011 | Ng et al. | 716/106 |
| 2003/0079189 A1 | 4/2003 | Abadir et al. | |
| 2003/0188246 A1 | 10/2003 | Rearick et al. | |
| 2007/0089076 A1 | 4/2007 | Amatangelo | |
| 2007/0162804 A1 | 7/2007 | Benware | |

OTHER PUBLICATIONS

Koo et al., "L2 Latch Design for Detecting Transition Faults", TDB, v36, n6A, Jun. 1993, p. 501-50, abstract, 1 page.
Goswami et al., Test Generation in the Presence of Timing Exceptions and Constraints, CAC 2007, Jun. 4-8, 2007, San Diego, California.
Majumdar et al., "Hold Time Validation on Silicon and the Relevance of Hazards in Timing Analysis", DAC 2006, Jul. 24-28, 2006, San Francisco, California.
Reddy et al, "On Validating Data Hold Times for Flip-Flops in Sequential Circuits", IEEE 2000.

* cited by examiner

*Primary Examiner* — Nghia Doan
*Assistant Examiner* — Binh Tat
(74) *Attorney, Agent, or Firm* — Hoffman Warnick LLC; Richard Kotulak

(57) ABSTRACT

A method of hold fault modeling and test generation. The method includes first modeling a fast-to-rise and a fast-to-fall hold fault for a plurality of circuit nets. Testing a fast-to-rise hold fault is accomplished by: setting up a logic value on each of the plurality of circuit nodes to 0; transitioning each of the plurality of circuit nodes from 0 to 1 with a single clock pulse; and determining if at least one downstream node was inadvertently impacted by the transitioning from 0 to 1. Testing a fast-to-fall hold is accomplished by: setting up a logic value on each of the plurality circuit nodes to 1; transitioning each of the plurality of circuit nodes from 1 to 0 with a single clock pulse; and determining if at least one downstream node was inadvertently impacted by the transitioning from 1 to 0.

15 Claims, 3 Drawing Sheets

HOLD TRANSITION FAULT MODEL AND TEST GENERATION METHOD

FIELD OF THE INVENTION

This disclosure is related to detecting hold faults in integrated circuits and more particularly to a hold transition fault model and test generation method.

BACKGROUND OF THE INVENTION

A hold fault occurs when there is a delay on the clock path to a capture memory element, and an intermediate memory element launches a transition twice in the time that the capture memory element captures only once. This causes data to move two levels of logic in one clock cycle or at one clock edge.

The classical transition fault model, based on slow-to-rise and slow-to-fall faults, can be used to test setup delay faults on data paths in logic. However, test generation using the classical transition fault model inherently favors setup tests on datapaths. Hold faults on short datapaths are tested only serendipitously. Testing of hold faults on short datapaths is not guaranteed using classical test generation algorithms, e.g., for stuck-at faults or transition faults, which incorporate two clock pulses to launch and capture a test pattern. In particular, the second clock pulse may overwrite the faulty value caused by a hold fault, thus masking such a fault. Accordingly, hold path testing is a difficult problem.

FIG. 1 depicts a simplified circuit 10 that illustrates a situation in which a hold fault may occur. Circuit 10 includes three flip flops 12, labeled A, B, and C for conveying data along a datapath 14a, 14b. As shown, there is some amount of delay 18 along the data path 14a between A and B, as well as datapath 14b between B and C. A clock path 16 drives each flip flop 12 (A, B, C), causing data stored in each flip flop to be output after, e.g., a clock transition from low to high. As shown, clock path 16 includes a delay between flip flops B and C that is greater than the delay along the datapath 14b. A hold fault can occur in this case because the data is transferred from A to B before C receives the clock pulse. When C finally receives the clock pulse, C captures the data that A sent to B instead of the data that was residing on B at the time clock pulse was issued.

Testing for hold faults along a short datapath (e.g., B to C) using existing techniques based on slow-to-rise and slow-to-fall faults is not guaranteed. In order to work, the test for the hold fault on the data input of C must ensure that values in the gating side latches allow the test to propagate on the first clock edge or clock pulse. However, existing techniques use two clock pulses to capture to launch and capture the test pattern.

In the presence of a hold fault, data will go from flip flop A to flip flop C in a single clock pulse. Using current techniques, a second clock pulse may overwrite any faulty value in flip flop C, masking the fact that a hold fault occurred.

SUMMARY OF THE INVENTION

Embodiments of the present invention provide a fast-to-rise and fast-to-fall transition fault pair model for testing hold faults on short datapaths. Using this hold transition fault model, rather than a serendipitous test, every internal net in the circuit can be tested as a hold fault site. Hence, an entire netlist can be covered for hold faults in a systematic, easy-to-implement manner.

In one embodiment, there is a method of hold fault modeling and test generation, comprising: modeling a fast-to-rise and a fast-to-fall hold fault for a plurality of circuit nets; testing a fast-to-rise hold fault by: setting up a logic value on each of the plurality of circuit nodes to 0; transitioning each of the plurality of circuit nodes from 0 to 1 with a single clock pulse; and determining if at least one downstream node was inadvertently impacted by the transitioning from 0 to 1; and testing a fast-to-fall hold fault by: setting up a logic value on each of the plurality circuit nodes to 1; transitioning each of the plurality of circuit nodes from 1 to 0 with a single clock pulse; and determining if at least one downstream node was inadvertently impacted by the transitioning from 1 to 0.

In a second embodiment, there is a method of fast-to-rise hold fault modeling and test generation, comprising: providing a circuit having a first stage of nodes, a second stage of nodes and a third stage of nodes; modeling a fast-to-rise hold fault on each of a set of test nodes between the second stage of nodes and the third stage of nodes; scanning values into the first stage of nodes and the second stage of nodes such that the test nodes have an initial value of 0 and a subsequent value of 1 upon a single clock pulse; marking each of a plurality of nodes from which at least one logic path to a node in the third stage of nodes is sensitized by the scanning; issuing the single clock pulse; and examining the third stage of nodes to identify hold faults.

In a third embodiment, there is a method of fast-to-fall hold fault modeling and test generation, comprising: providing a circuit having a first stage of nodes, a second stage of nodes and a third stage of nodes; specifying a set of test nodes between the second stage of nodes and the third stage of nodes; modeling a fast-to-fall hold fault on each of said set of test nodes; scanning values into the first stage of nodes and the second stage of nodes such that the set of test nodes have an initial value of 1 and a subsequent value of 0 upon a single clock pulse; marking each of a plurality of nodes from which at least one logic path to a node in the third stage of nodes is sensitized by the scanning; issuing the single clock pulse; and examining the third stage of nodes to identify hold faults.

The illustrative aspects of the present invention are designed to solve the problems herein described and other problems not discussed.

BRIEF DESCRIPTION OF THE DRAWINGS

These and other features of this invention will be more readily understood from the following detailed description of the various aspects of the invention taken in conjunction with the accompanying drawings.

Figure 1:
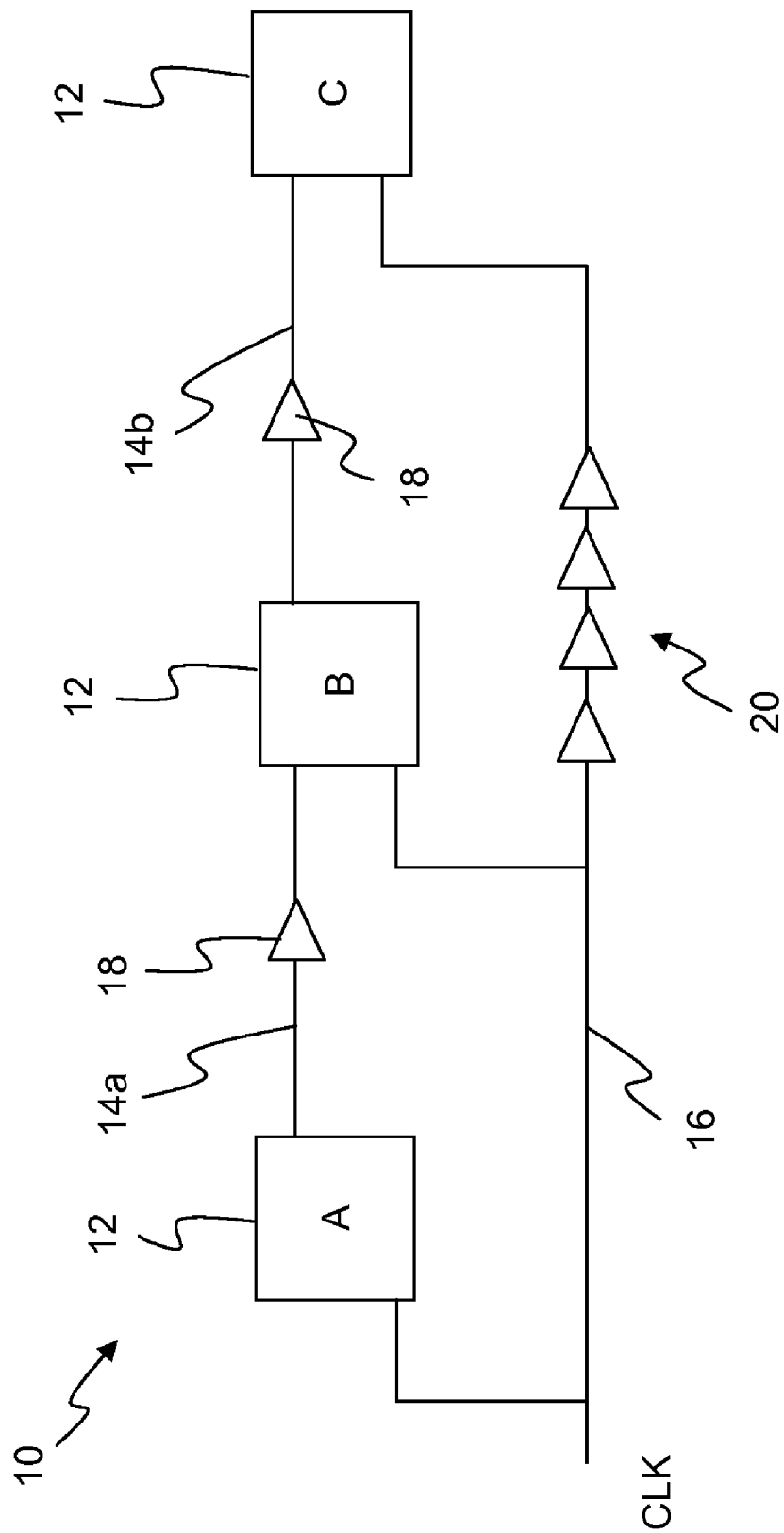
FIG. 1 depicts a circuit having a potential hold fault in accordance with an embodiment of the present invention.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

A fast-to-rise and fast-to-fall transition fault pair model and methodology for testing hold faults is described. In general, a fast-to-rise hold fault occurs when, during a single clock pulse, an intended transition from 0 to 1 at a node in a circuit also results in the 1 being propagated to a downstream node, inadvertently impacting the downstream node. Similarly, a fast-to-fall hold fault occurs when, during a single clock pulse, an intended transition from 1 to 0 at a node in the circuit also results in the 0 being propagated to a downstream node inadvertently impacting the downstream node.

Note that hold faults can be activated by either single clock pulses or single clock edges, and the embodiments of the present invention are equally applicable to both situations. Accordingly, the term "single clock pulse" is used to represent both single clock pulses and single clock edges.

Hold fault testing on a simple circuit in accordance with an embodiment is described with reference to FIG. 1, in which datapaths 14a, 14b traverse a setup flip flop A, a launch flip flop B, and capture flip flop C. As noted, a hold fault on the "short" path B-C will occur if data from setup flip flop A is propagated to capture flip flop C in one clock pulse. To test for hold faults, a predetermined value, e.g., 0, is first scanned into launch flip flop B to cause the datapath between B-C to go to 0. Set up flip flop A is loaded with the opposite value, e.g., 1, such that launch flip flop B will change states upon a clock pulse. A clock pulse is then generated causing launch flip flop B and the B-C datapath 14b to go from 0 to 1. Capture flip flop C should receive the value 0 upon issuance of the clock pulse, which was the value scanned into the B-C datapath 14b prior to the clock pulse. To test for a hold fault, capture flip flop C is examined and if the value in capture flip flop C is 0, then no fault is detected since the value on datapath 14b was properly captured by capture flip flop C. If however, the value in capture flip flop C is a 1, a hold fault is detected since the value in setup flip flop A propagated all the way to capture flip flop C in a single clock pulse.

A further embodiment of hold fault testing is described with reference to a complex circuit structure 30 shown in FIG. 2. Complex circuit structure 30 may comprise any type of circuit, such as an integrated circuit made up of a plurality of nets. In this example, complex circuit structure 30 includes three stages (A, B, C) with logic 32 situated between stages A and B and logic 34 situated between stages B and C. Stages A and B each generally comprise a set of nodes 44, 46 residing along datapaths to be tested. Nodes 44, 46 may for example comprise memory elements (flip flops, latches, etc.), or simply comprise external input pins at which data can be scanned in. Stage C includes a set of nodes 48, which generally comprises memory elements that can be examined to determine if a hold fault occurred.

To test for hold faults, (1) nodes at stages A and B are loaded with predetermined values, (2) a single clock pulse is generated; and (3) nodes at stage C are examined. Because of the complex nature of the circuit structure 30, a model is first developed that accounts for the logic 32, 34 between each stage and determines what values must be scanned in to test for hold faults at different locations within logic 34. Namely, for testing purposes, required input values and expected output values for each node will depend on the specific logic that makes up the associated datapath. Any technique for modeling to identify potential hold faults using a single clock pulse may be utilized (such as that described with regard to FIG. 1 above).

Figure 2:
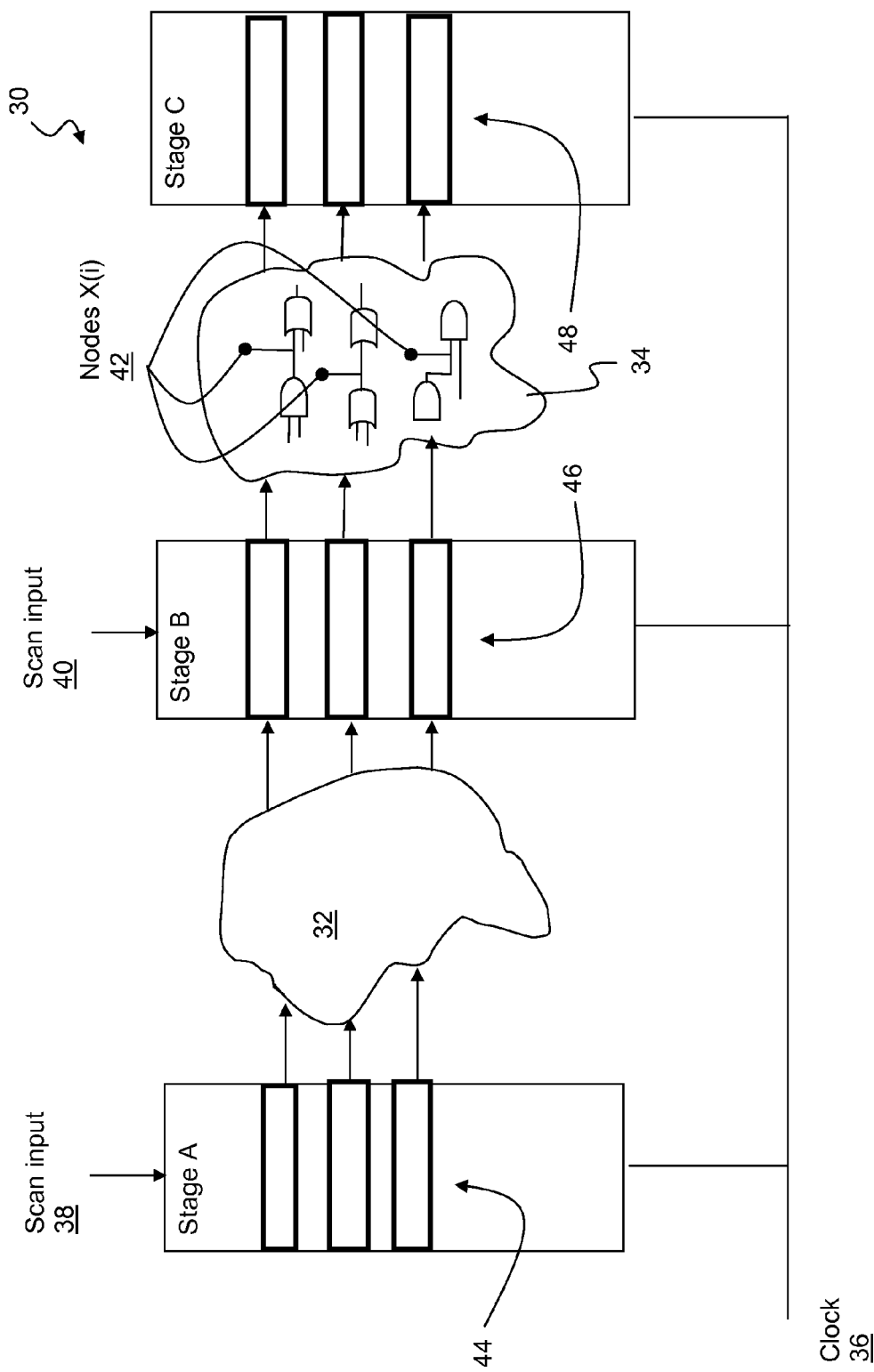
FIG. 2 depicts a circuit that depicts how stages can be utilized to test for hold faults in accordance with an embodiment of the present invention.

In the example shown in FIG. 2, logic 34 includes a set of nodes X(i) 42, which represent any number of internal points (or nets) within logic 34 at which hold fault testing can occur (i=1, 2, 3 . . . ). Using this technique, any number of nodes X(i) 42 (e.g., every net in an integrated circuit) may be tested. Nodes X(i) 42 may be tested sequentially, in parallel, or both. In this example, three datapaths that traverse stages A, B and C are tested in parallel. However, it is understood that any number of datapaths may be tested concurrently. Generally, each datapath being tested includes at least one associated node X(i) 42 and an associated memory element 48 in stage C where a resulting downstream value can be examined.

To test for fast-to-rise hold faults in the circuit structure 30, the following procedure may be utilized. Scan input 40 is scanned into the nodes 46 in stage B in accordance with the defined model to cause each node X(i) 42 to have a logic value of 0. As noted, nodes 46 may include memory elements and/or couple directly into logic 34. Intervening logic between stage B and nodes X(i) 42 will dictate the appropriate scan values to achieve this result. Scan input 38 is scanned into the nodes 44 of stage A to cause each node X(i) 42 to change states from a 0 to a 1 upon a clock pulse from clock 36. Logic 32 and intervening logic between stage B and nodes X(i) 42 will dictate the appropriate scan values to achieve this result. Any scanning techniques for accomplishing this may be utilized and such techniques are understood in the art.

Once the scanning operations are complete, a clock pulse is generated by clock 36. To identify hold faults, memory elements 48 in stage C are examined. If each memory element has a value that corresponds with an associated pin value of 0, then there are no detected fast-to-rise hold faults. In other words, intervening logic between a given node X(1) 42 and an associated memory element 48 will dictate whether the downstream memory element 48 should have a 0 or a 1 to correspond with a node X(1) value of 0. Conversely, if one or more of the downstream memory elements 48 has a value that corresponds with an associated node value X(i) of 1, then a fast-to-rise hold fault (i.e., inadvertent impact) occurred.

To test for fast-to-fall hold faults in the circuit structure 30, the opposite procedure is utilized. Namely, scan input 40 is scanned into stage B nodes 46 to cause each node X(i) 42 to have a logic value of 1. Scan input 38 scans values into stage A nodes to cause each node X(i) 42 to change states from a 1 to a 0 upon a clock pulse from clock 36.

Once the scanning is complete, a clock pulse is generated by clock 36. Next, memory elements in stage C are examined to identify hold faults. If each memory element has a value that corresponds with an associated node X(i) value of 1, then there are no fast-to-rise hold faults. Conversely, if one or more of the memory elements 48 have a value that corresponds with an associated node value X(i) of 0, then a fast-to-fall hold fault (i.e., inadvertent impact) occurred.

Figure 3:
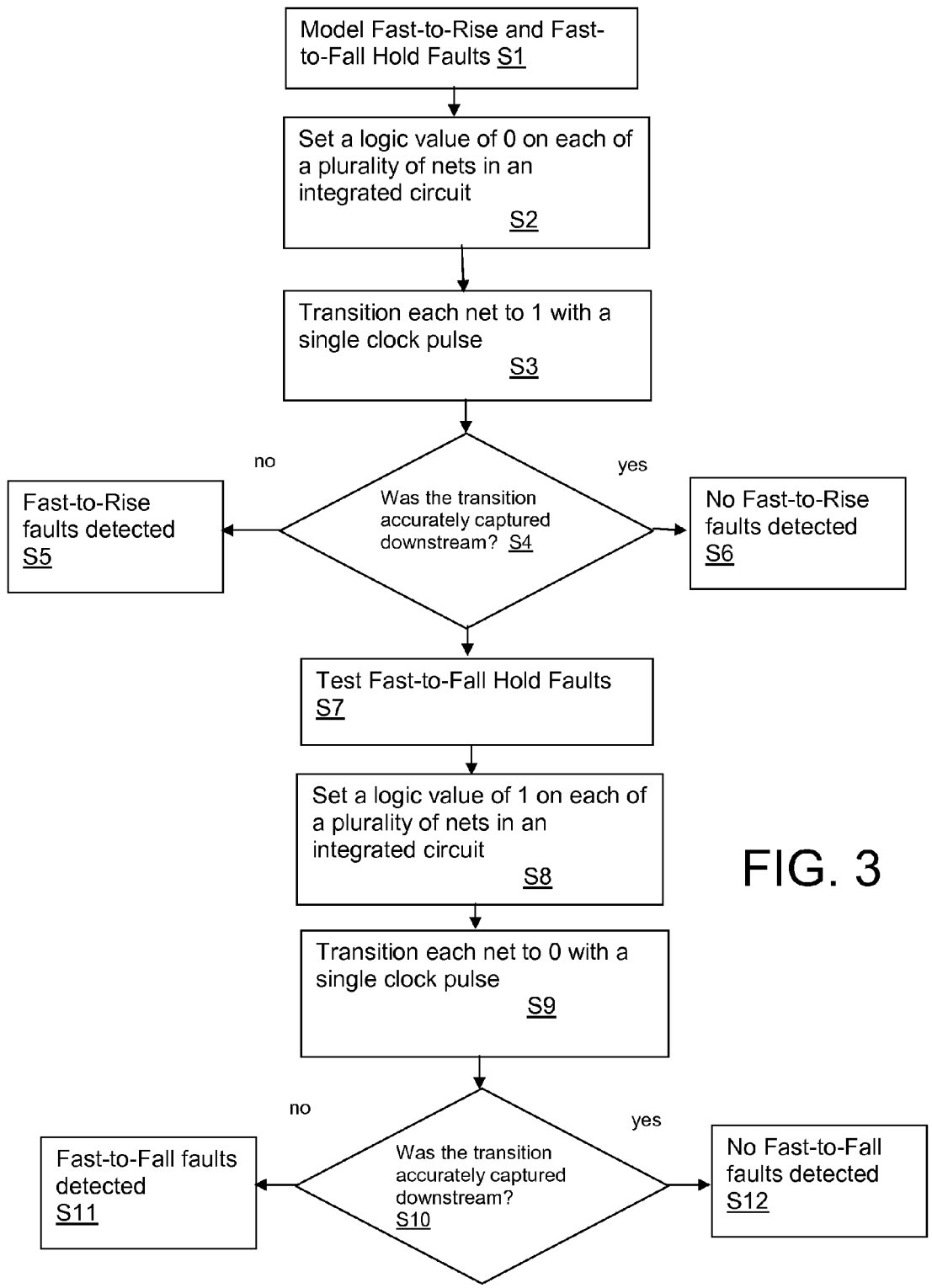
FIG. 3 depicts a flow diagram for a method for hold fault testing in accordance with an embodiment of the invention.

FIG. 3 depicts an illustrative embodiment that includes modeling both a fast-to-rise and fast-to-fall transition fault on a plurality of internal circuit nets in an integrated circuit. At S1, fast-to-rise and fast to fall hold faults are modeled, e.g., as described herein. At S2, a logic value is set on each net to be tested to 0, and at S3 each net is transitioned to 1 with a single clock pulse. A determination is made at S4 whether the transition was accurately captured downstream (i.e., at a subsequent stage) by the single clock pulse. If the transition was accurately captured, then no fast-to-rise faults occurred at S6. If the transition was not accurately captured, then at least one fast-to-rise fault occurred at S5.

Next, fast-to-fall faults are tested at S7. This includes setting up a logic value on each net to be tested to 1 at S8. At S9, each net being tested is transitioned to 0 with single clock pulse. At S10, a determination is made whether the transition was accurately captured downstream by the single clock pulse. If the transition was accurately captured, then no fast-to-fall faults occurred at S12. If the transition was not accurately captured, then at least one fast-to-fall fault occurred at S11. Note that while this embodiment describes testing fastto-rise hold faults first, fast-to-fall hold faults could be tested first, and both could be tested simultaneously on different nets.

Accordingly, an embodiment of the present invention contemplates two primary processes to test a circuit. The two processes include: (1) test generation, i.e., creating/modeling a test and calculating the expected results in downstream nodes that would be seen if no faults in the circuit exist; and (2) test application, i.e., inputting values to determine if faults are detected based on behaviors of downstream nodes.

In one modeling embodiment, a fast-to-rise and a fast-to-fall hold transition fault is modeled on every net in the circuit. A list of all potential faults in the circuit is created, referred to as a fault model. The objective of test generation is to "mark" all the faults in the fault model as tested by generating test patterns that "mark" one or more faults in the fault model.

Test patterns that test the faults in the fault model are created along with the expected test results that would be observed, were there no faults in the circuit. A hold transition fault is considered tested by a test pattern if all three of the following functions are satisfied by the test pattern.
1. An initial logic value is applied to the net;
2. A single clock pulse is applied that would cause the net to transition to the opposite logic value; and
3. At least one sensitized logic path exists from the net to a downstream node to propagate the logic values from the net to the downstream node.

A sensitized logic path is one through which a logic value can propagate from a source to a sink without being blocked midway. For example a logic path passing through an AND gate where the other input of the AND gate is 1 is a sensitized logic path since the AND gate will allow the logic value on the path through. On the contrary, a logic path passing through an AND gate where the other input of the AND gate is 0 is not a sensitized logic path since the AND gate will block the logic value on the path at the AND gate. Hence, a test pattern created to test a hold transition fault must do all three of the above functions, including sensitize at least one logic path from the net-under-test to at least one downstream node.

It is entirely possible that a test pattern may apply the initial logic value to the net, however not sensitize the required logic path to a downstream node. In this case, this test pattern is considered to have not tested that hold transition fault.

One or more hold transition faults may be tested by any single created test pattern, i.e., a created test pattern may be able to simultaneously do all three functions above for more than one hold fault. In this case, all the hold faults that are considered tested by that test pattern are marked as "tested" in the master list, i.e., fault model, of all faults of the circuit. Then, a new test pattern is created to mark the remaining untested faults in the fault model. The process of creating a test pattern is repeated until all the faults in the fault model have been marked "tested." In a typical embodiment, there may be 15000 test patterns for a large circuit.

After the test patterns have been created, the first test pattern is actually applied to the circuit by scanning in the single test pattern, applying the single clock pulse, and measuring the downstream nodes. If the test result observed in a downstream node does not match the expected result, that test pattern is considered to have detected a fault in the circuit hardware. Next, the second test pattern is applied, etc., until all test patterns have been applied.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A method of hold fault modeling and test generation performed by at least one computer device, the method comprising:
   modeling a fast-to-rise and a fast-to-fall hold fault for a plurality of nets in an integrated circuit using the at least one computer device;
   testing a fast-to-rise hold fault by:
      setting up a logic value on each of the plurality of nets in the integrated circuit to a logic value of 0;
      transitioning each of the plurality of nets in the integrated circuit from a the logic value of 0 to a logic value of 1 with a single clock pulse; and
      determining whether the fast-to-rise hold fault occurred by determining whether the transitioning was accurately captured in all of a downstream subset of nets in the plurality of nets in the integrated circuit,
      wherein the fast-to-rise hold fault is indicated by the transitioning being inaccurately captured in at least one of the downstream subset of nets; and testing a fast-to-fall hold fault by:
      setting up a logic value on each of the plurality of nets in the integrated circuit to a logic value of 1;
      transitioning each of the plurality of nets in the integrated circuit from the logic value of 1 to a logic value of 0 with a single clock pulse; and
      determining whether the fast-to-fall hold fault occurred by determining whether the transitioning was accurately captured in all of the downstream subset of nets in the plurality of nets in the integrated circuit,
      wherein the fast-to-fall hold fault is indicated by the transitioning being inaccurately captured in at least one of the downstream subset of nets.

2. The method of claim 1, further comprising marking each of the plurality of nets in the integrated circuit from which at least one logic path to at least one downstream node is sensitized.

3. The method of claim 2, further comprising repeating the process for each of a plurality of test patterns until all of the plurality of nets in the integrated circuit are marked.

4. The method of claim 1, wherein each net in the at least one downstream subset of nets comprises a memory element.

5. The method of claim 1, wherein the setting up of logic values comprises scanning values into nets in the integrated circuit based on the modeling.

6. A method of fast-to-rise hold fault modeling and test generation performed by at least one computer device, the method comprising:
   providing a circuit having a first stage of nodes, a second stage of nodes and a third stage of nodes;
   modeling a fast-to-rise hold fault on each of a set of test nodes between the second stage of nodes and the third stage of nodes, using the at least one computer device;
   scanning values into the first stage of nodes and the second stage of nodes such that the test nodes have an initial value of 0 and a subsequent value of 1 upon a single clock pulse;
   marking each of a plurality of nodes from which at least one logic path to a node in the third stage of nodes is sensitized by the scanning;
   issuing the single clock pulse; and
   examining the third stage of nodes to identify hold faults, wherein the examining of the third stage of nodes include determining whether switching from the initial value of 0 to the subsequent value of 1 in the test notes is accurately captured in all of the third stage of nodes, and wherein the fast-to-rise hold fault is indicated by the switching from the initial value of 0 to the subsequent value of 1 being inaccurately captured in at least one of the third stage of nodes.

7. The method of claim 6, further comprising repeating with a different test pattern until all of the test nodes are marked.

8. The method of claim 6, wherein each node in the third stage of nodes comprises a memory element.

9. The method of claim 6, wherein each test node comprises a circuit net.

10. The method of claim 6, wherein the circuit comprises an integrated circuit.

11. A method of fast-to-fall hold fault modeling and test generation performed by at least one computer device, the method comprising:

providing a circuit having a first stage of nodes, a second stage of nodes and a third stage of nodes;

specifying a set of test nodes between the second stage of nodes and the third stage of nodes;

modeling a fast-to-fall hold fault on each of said set of test nodes, using the at least one computer device;

scanning values into the first stage of nodes and the second stage of nodes such that the set of test nodes have an initial value of 1 and a subsequent value of 0 upon a single clock pulse;

marking each of a plurality of nodes from which at least one logic path to a node in the third stage of nodes is sensitized by the scanning;

issuing the single clock pulse; and examining the third stage of nodes to identify hold faults, wherein the examining of the third stage of nodes include determining whether switching from the initial value of 1 to the subsequent value of 0 in the test notes is accurately captured in all of the third stage of nodes, and wherein the fast-to-rise hold fault is indicated by the switching from the initial value of 1 to the subsequent value of 0 being inaccurately captured in at least one of the third stage of nodes.

12. The method of claim 11, further comprising repeating with a different test pattern until all of the test nodes are marked.

13. The method of claim 11, wherein each node in the third stage of nodes comprises a memory element.

14. The method of claim 11, wherein each test node comprises a circuit net.

15. The method of claim 11, wherein the circuit comprises an integrated circuit.

* * * * *